US011494002B2

(12) United States Patent
Khan et al.

(10) Patent No.: US 11,494,002 B2
(45) Date of Patent: Nov. 8, 2022

(54) IMMERSIVE DISPLAY CONTROLLED BY HAPTIC SWITCH

(71) Applicant: LOWE'S COMPANIES, INC., Mooresville, NC (US)

(72) Inventors: Arnab Khan, Wilmington, DE (US); Blake Gordon, Kennesaw, GA (US)

(73) Assignee: LOWE'S COMPANIES, INC., Mooresville, NC (US)

( * ) Notice: Subject to any disclaimer, the term of this patent is extended or adjusted under 35 U.S.C. 154(b) by 0 days.

(21) Appl. No.: 17/258,978

(22) PCT Filed: Jul. 15, 2019

(86) PCT No.: PCT/US2019/041749
§ 371 (c)(1),
(2) Date: Jan. 8, 2021

(87) PCT Pub. No.: WO2020/018396
PCT Pub. Date: Jan. 23, 2020

(65) Prior Publication Data
US 2021/0311560 A1    Oct. 7, 2021

Related U.S. Application Data

(60) Provisional application No. 62/698,573, filed on Jul. 16, 2018, provisional application No. 62/725,534, filed on Aug. 31, 2018.

(51) Int. Cl.
*G06F 3/02*    (2006.01)
*G06T 15/02*    (2011.01)
(Continued)

(52) U.S. Cl.
CPC .......... *G06F 3/0202* (2013.01); *G06F 3/1446* (2013.01); *G06F 30/13* (2020.01);
(Continued)

(58) Field of Classification Search
CPC ...... G06F 3/0202; G06F 3/1446; G06F 30/13; G06F 3/0219; G06Q 30/0643; G06T 15/02; G06T 17/00; G06T 2200/24
See application file for complete search history.

(56) References Cited

U.S. PATENT DOCUMENTS 9,756,604 B1 *   9/2017   Levesque ................ G06F 3/016
2003/0011503 A1    1/2003   Levenson
(Continued)

FOREIGN PATENT DOCUMENTS

WO    2020018396 A1    1/2020

OTHER PUBLICATIONS

International Preliminary Report on Patentability for PCT application No. PCT/US2019/041749, dated Jan. 19, 2021, 9 pages.
(Continued)

*Primary Examiner* — Afroza Chowdhury
(74) *Attorney, Agent, or Firm* — Kilpatrick Townsend & Stockton LLP

(57) ABSTRACT

A haptic switch can be used to control one or more display screens. In an example embodiment, the haptic switch takes the form of a flooring sample—such as a sample piece or swatch of a flooring material, for example, ceramic tile, wood, or carpet—that is affixed or otherwise mechanically coupled to an electronic sensor, such as a proximity sensor, a touch sensor, or a pressure sensor. The haptic switch is communicatively coupled to a machine, and the machine stores or is otherwise able to access a database that correlates the haptic switch or its included flooring sample to corresponding texture map data that depicts the flooring sample. The haptic switch is thus usable to select its corresponding texture map data and cause the machine to use the selected texture map data in generating video content and displaying the generated video content on one or more display screens.

20 Claims, 4 Drawing Sheets

(51) Int. Cl.
*G06T 17/00* (2006.01)
*G06F 3/14* (2006.01)
*G06F 30/13* (2020.01)
*G06Q 30/06* (2012.01)

(52) U.S. Cl.
CPC .............. *G06T 15/02* (2013.01); *G06T 17/00* (2013.01); *G06Q 30/0643* (2013.01); *G06T 2200/24* (2013.01)

(56) References Cited

U.S. PATENT DOCUMENTS

2012/0259743 A1 10/2012 Pate, Jr.
2017/0115733 A1* 4/2017 Du .................. G06F 3/0416

OTHER PUBLICATIONS

International Search Report and Written Opinion for PCT application No. PCT/US2019/041749, dated Oct. 11, 2019, 11 pages.
Application No. CA3106018, Office Action, dated Apr. 20, 2022, 3 pages.

* cited by examiner

IMMERSIVE DISPLAY CONTROLLED BY HAPTIC SWITCH

PRIORITY CLAIM

This application is a national stage entry of PCT/US2019/041749, filed on Jul. 15, 2019, which claims the priority benefit of U.S. Provisional Patent Application No. 62/698,573, filed Jul. 16, 2018, and U.S. Provisional Patent Application No. 62/725,534, filed Aug. 31, 2018, all of which are incorporated herein by reference in their entirety.

TECHNICAL FIELD

The subject matter disclosed herein generally relates to the technical field of special-purpose machines that facilitate management of an environment, including software-configured computerized variants of such special-purpose machines and improvements to such variants, and to the technologies by which such special-purpose machines become improved compared to other special-purpose machines that facilitate management of an environment. Specifically, the present disclosure addresses systems and methods to facilitate provision of one or more immersive displays.

BACKGROUND

A machine may be configured to interact with one or more users by adjusting or otherwise modifying an environment, such as a booth, a room, or a building, in response to one or more user inputs. For example, a temperature controller machine may raise or lower the ambient air temperature of a room (e.g., by suitably controlling an air conditioner, heater, or both) in response to a user-submitted selection of a temperature at which the room should be maintained. As another example, a lighting controller machine may increase or decrease the brightness of one or more lamps or other lighting elements in the room in response to a user-submitted selection of a desired lighting level.

BRIEF DESCRIPTION OF THE DRAWINGS

Some embodiments are illustrated by way of example and not limitation in the figures of the accompanying drawings.

DETAILED DESCRIPTION

Figure 1:
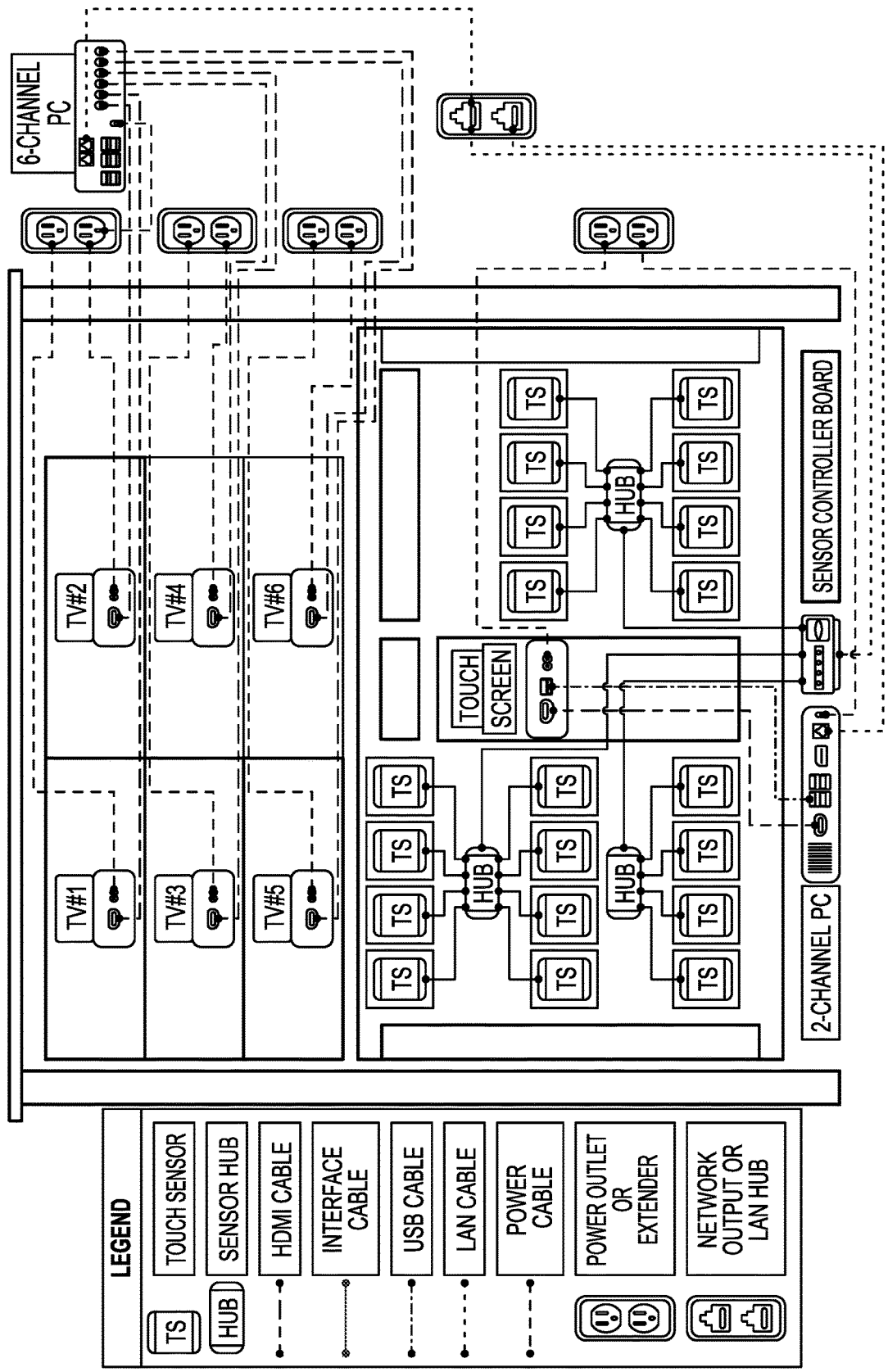
FIG. 1 is a network diagram illustrating an example embodiment in which a first machine and a second machine provide an immersive visual experience via respectively corresponding display screens, according to some example embodiments.

Example methods (e.g., algorithms) facilitate provision of one or more immersive displays controlled by one or more haptic switches, and example systems (e.g., special-purpose machines configured by special-purpose software) are configured to facilitate such provision. Examples merely typify possible variations. Unless explicitly stated otherwise, structures (e.g., structural components, such as modules) are optional and may be combined or subdivided, and operations (e.g., in a procedure, algorithm, or other function) may vary in sequence or be combined or subdivided. In the following description, for purposes of explanation, numerous specific details are set forth to provide a thorough understanding of various example embodiments. It will be evident to one skilled in the art, however, that the present subject matter may be practiced without these specific details.

A haptic switch can be used to control one or more immersive displays (e.g., single-screen or multi-screen display panels). In this context, a haptic switch is a switch that provides a user with a haptic sensation that guides the user in deciding whether to operate the haptic switch. According to various example embodiments, a haptic switch is configured to offer the user a touchable surface that corresponds to something that is selectable by operation of the haptic switch. In particular, the touchable surface may feel like (e.g., in terms of hardness, softness, texture, temperature, etc.) a material that becomes selected when the haptic switches operated.

In an example embodiment, the haptic switch takes the form of a flooring sample (e.g., a sample piece or swatch of a flooring material, such as ceramic tile, wood, or carpet) that is affixed or otherwise mechanically coupled to an electronic sensor, such as a proximity sensor, a touch sensor, or a pressure sensor. The haptic switch is communicatively coupled (e.g., via a serial connection or other network connection) to a machine (e.g., computer system), and the machine stores or is otherwise able to access a database that correlates (e.g., maps or assigns) the haptic switch to corresponding texture map data (e.g., a set of one or more texture images) that depicts the flooring sample.

Thus configured, the haptic switch is usable to select its corresponding texture map data and cause the machine to use the selected texture map data in generating video content (e.g., still or motion pictures formatted for video presentation) and displaying the generated video content on one or more display screens. For example, the haptic switch may select what texture map data is caused by the machine to be displayed on a floor-mounted display screen upon which a user is standing when operating the haptic switch. As another example, the selected texture map data may be applied by the machine to a three-dimensional (3D) model of a room, and the texture mapped 3D model may be caused by the machine to be rendered to create video content, which may then be displayed on a wall-mounted display screen near where the user is standing when operating the haptic switch. According to various example embodiments, the 3D model may be predetermined (e.g., depicting a standard room in a standard house) or custom-generated based on one or more photographs supplied to the machine by the user (e.g., from a storage device, such as a smart phone or flash drive). In some example embodiments, the material of the flooring sample is also suitable for a ceiling (e.g., wood), and the selected texture map data may be caused by the machine to be displayed on a ceiling-on a display screen above the user.

With its integrated flooring sample as a hand-touchable contact point for the user to manipulate, the haptic switch provides the user with a video content selection mechanism that results in one or more of such immersive displays presenting video content that depicts large-scale use of the flooring sample (e.g., on a floor beneath the user, on the floor extending away from the user into a room, or both). The haptic switch thus enables the user to feel by hand what the depicted large-scale use would feel like underfoot (e.g., in terms of hardness, texture, elasticity, thermal conductivity, etc.).

According to some example embodiments, the video content of a display screen is generated by the machine based on a predetermined 3D model a room. For example, in response to a corresponding haptic switch being operated (e.g., activated) by a user, a set of texture images (e.g., texture maps) that depict the flooring sample included in the haptic switch may be accessed by the machine (e.g., from internal storage or a networked database), and machine may apply the set of texture images to a default 3D model of a room (e.g., by tiling or scaling the set of texture images over the floor of the room, as represented in the 3D model). The machine may then generate video content by rendering the texture mapped 3D model and then provide the generated video content to a display screen (e.g., mounted on a wall within a booth, a kiosk, a room, or a building) for display thereon.

According to certain example embodiments, the video content of the display screen is generated by the machine based on a dynamically generated 3D model of a room. For example, a user may provide the machine with access to one or more photographs of a room (e.g., via an authentication to a network-accessible database, via a wireless network connection to a smart phone, or by plugging a storage device into the machine), and the machine may execute a photographic analysis algorithm that generates a 3D model of the room based on the accessed one or more photographs. Then, in response to a corresponding haptic switch being operated by a user, a set of texture images that depict the flooring sample included in the haptic switch may be accessed by the machine, and the machine may apply the set of texture images to the custom-generated 3D model of the room. The machine may then generate video content for the display screen by rendering the texture mapped 3D model as described above.

To further illustrate some example embodiments, consider a walk-in structure, such as a booth, in which the above-described machine and one or more haptic switches are used to provide a visually immersive experience triggered by a haptic switch. Equipped with the machine and one or more haptic switches, the walk-in structure facilitates shopping for flooring by bridging the gap between customer-oriented retail environments and the traditional floor-buying process, thus providing an intuitive way to easily sample and visualize flooring styles (e.g., within a large retail store or warehouse environment). The walk-in structure (e.g., by virtue of the one or more haptic switches) combines flooring materials with interactive technology that allows a user (e.g., shopper) to navigate available choices naturally through touch.

A table within the walk-in structure may display, for example, twenty flooring samples (e.g., twelve hard surface samples and eight carpet samples) that are each affixed to or otherwise mechanically coupled to a corresponding sensor (e.g., proximity sensor, touch sensor, pressure sensor, or any suitable combination thereof). When a user operates (e.g., activates) one of these twenty haptic switches by touching the corresponding flooring sample, the corresponding sensor is triggered and sends a message to a sensor controller (e.g., a sensor controller board). The sensor controller then sends a message to the machine (e.g., a custom-configured computer system), which may be located within the table or elsewhere within the walk-in structure. The machine interprets the message from the sensor controller and accordingly selects texture map data (e.g., a set of one or more texture map images) that depicts the touched flooring sample and therefore corresponds to the operated haptic switch.

In some example embodiments, multiple sets of texture map images (e.g., with the same pattern but in different colors) all correspond to the touched flooring sample, and the machine causes the touchscreen to present the user interface that enables (e.g., prompts) the user to disambiguate which set of texture map image should be used. In such situations, the user submits a disambiguation criterion (e.g., a color selection) via the user interface, and the machine accordingly selects the disambiguated texture map data that corresponds to both the touched flooring sample and the disambiguation criterion.

Having selected the texture map data, the machine generates one or more pieces of video content (e.g., a first motion or still picture of a floor for a floor-mounted display screen, a second motion or still picture of a room for a wall-mounted display screen, a third motion or still picture of the floor for a table-mounted display screen, or any suitable combination thereof) based on the selected texture map data. The generated one or more pieces of video content are then caused by the machine to be displayed on one or more corresponding display screens (e.g., a table-mounted display screen, a multi-screen video wall, a multi-screen video floor, or any suitable combination thereof). These one or more display screens accordingly provide a large-area immersive visual experience with the floor sample that was touched to activate the corresponding haptic switch.

According to some example embodiments, a user can use the walk-in structure and its included table to view the same flooring sample in different room settings (e.g. in a kitchen, living room, bedroom, etc.), as well as view carpets in multiple carpet colors. Once a desirable flooring sample is found, the user may request that it be added to a corresponding shopping cart by using a touchscreen interface presented by a display screen in the table. When finished browsing flooring samples, the user can proceed into a checkout process via the same touchscreen interface. The checkout process sends a barcode to the user's smart phone, and this barcode can be used to purchase copies of the desired flooring samples at the retail store's checkout line. The user then receives his or her personalized sample box in the mail within a few business days.

According to various example embodiments, the user can select a set of one or more flooring samples (e.g., using a touchscreen interface), request (e.g., via text message) a transaction code (e.g., a bar code) to pay for flooring samples at a checkout counter, select a pile length (e.g., for each flooring sample), select one or more options (e.g., upgrades) to be applied (e.g., to each flooring sample), submit dimensional information for one or more rooms, request an in-home appointment with an interior designer, request that the user's research session be suspended, saved, and continued online at a device of the user (e.g., the user's mobile device or home computer), or any suitable combination thereof.

For purposes of clarity and brevity, several example embodiments of the present subject matter are described herein with one or more haptic switches each including a corresponding flooring sample (e.g., a sample piece or swatch of a flooring material, such as carpet, ceramic tile, wood, stone, or vinyl). However, in additional example embodiments of the present subject matter, one or more haptic switches may each include a corresponding sample of other material. As examples, such a corresponding sample may be or include an upholstery sample (e.g., a sample piece or swatch of upholstery material, such as fabric, vinyl, or leather), a wall covering sample (e.g., a sample piece or swatch of wall covering material, such as wallpaper or applied wall texturing), a kitchen surface sample (e.g., a sample piece or swatch of kitchen surfacing material, such as countertop tile or countertop stone), or a bathroom surface sample (e.g., a sample piece or swatch of bathroom surfacing material, such as bathroom tile or bathroom stone). Accordingly, where suitable, the flooring sample in a haptic switch may be replaced with a different kind of sample (e.g., a flooring sample, an upholstery sample, a wall covering sample, a kitchen surface sample, a bathroom surface sample, or any suitable combination thereof), in various example embodiments of the present subject matter.

FIG. 1 is a network diagram illustrating an example embodiment in which two machines, a first machine (e.g., a 2-video-channel computer) and a second machine (e.g., a 6-video-channel computer), work together to provide an immersive visual experience via two respectively corresponding display screens, a first display screen (e.g., a touchscreen affixed to a table) and a second display screen (e.g., a wall-mounted 6-screen video display).

As shown in FIG. 1, a table includes a set of proximity sensors (e.g., twenty in number) that are all communicatively coupled (e.g., connected via one or more sensor hubs, such as the three sensor hubs shown) to a sensor controller (e.g., a sensor controller board). Each proximity sensor in the set may be affixed a corresponding flooring sample, as described above, and the combination of the proximity sensor and its corresponding flooring sample may accordingly function as a haptic switch that is connected or otherwise communicatively coupled to the sensor controller. In some implementations, each proximity sensor may be equipped with a corresponding metal plate (e.g., an aluminum plate) to extend the range of the proximity sensor.

The first machine is shown in the example form of a 2-channel computer, and the first machine is configured to control the first display screen. The first display screen is shown in the example form of a touchscreen, which may be included in the table or mounted thereupon. The first machine is additionally communicatively coupled (e.g., via a network connection) to the sensor controller and to the second machine.

The second machine is shown in the example form of a 6-channel computer, and the second machine is configured to control the second display screen. The second display screen is shown in the example form of a 6-screen video wall. The second machine is additionally communicatively coupled (e.g., via a network connection) to the sensor controller and to the first machine.

The first and second machines may be remotely managed by a third machine, such as a computer system that implements a digital signage management server. This third machine may provide remote device management services, content management services, and analytics services. The first and second machines can be remotely monitored by the third machine and accessed therefrom to enable remote restarts, application restarts, software patches, live preview of the generated video content, viewing of computer system health (e.g., processor utilization, memory, temperature, etc.), or any suitable combination thereof.

The third machine (e.g., functioning as a remote management platform) may also enable the user interface applications and the content within them to be managed and updated. In doing so, the user interface for one or more of the display screens (e.g., the touchscreen affixed to the table) can be updated conveniently as needed, and the texture map data that corresponds to the various flooring samples can be changed without an in-store visit by a system administrator. Furthermore, the first and second machines can be managed in conjunction with other first and second machines in other walk- and structures to enable different configurations (e.g. different flooring samples and associated texture map data) by store, retailer, or region of the country.

Figure 2:
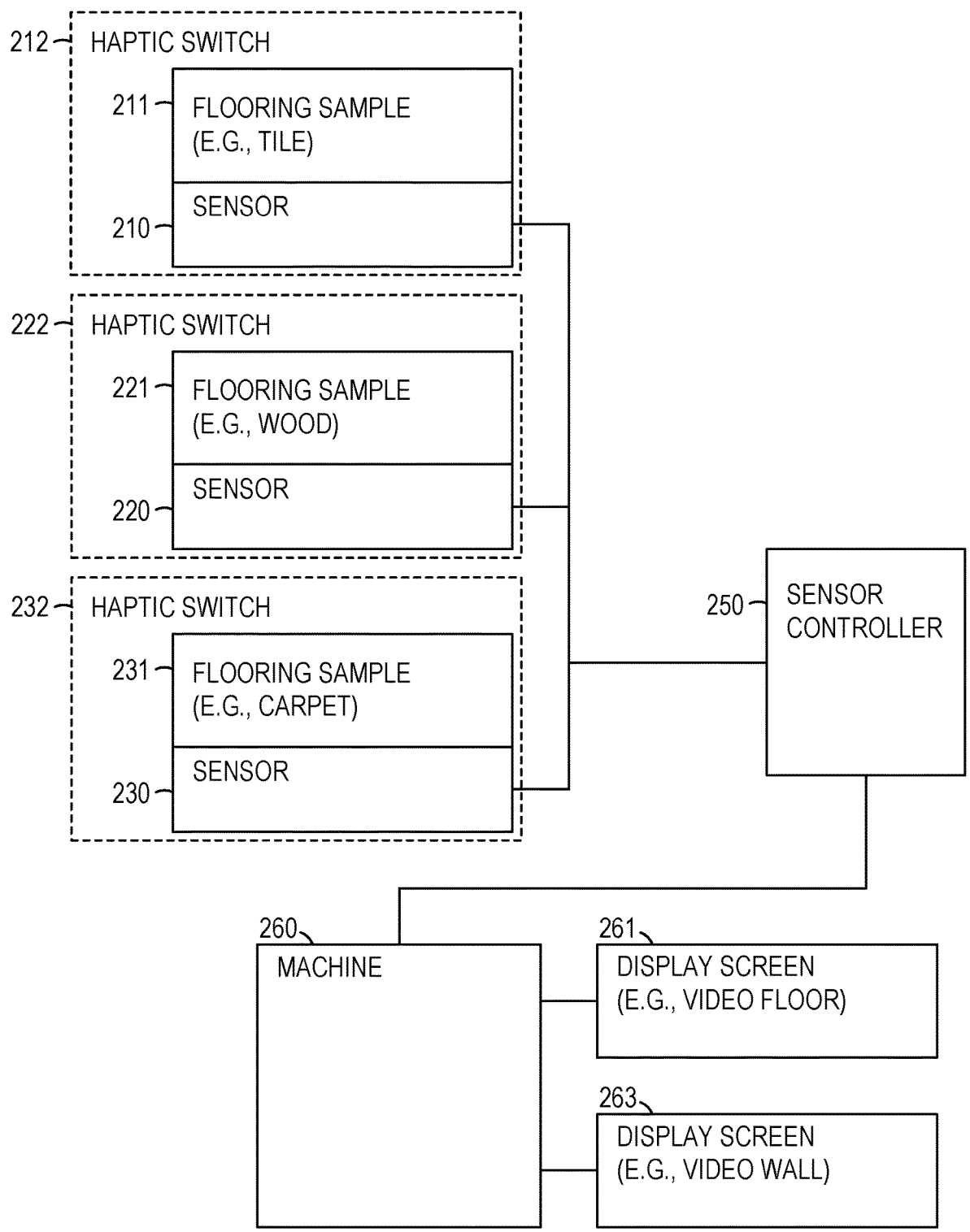
FIG. 2 is a block diagram illustrating a set of haptic switches connected to a sensor controller, a video generation machine, and multiple display screens, according to some example embodiments.

FIG. 2 is a block diagram illustrating a set of haptic switches 212, 222, and 232 connected to a sensor controller 250, a machine 260 (e.g., a video generation machine, as described above), and multiple display screens 261 and 263, according to some example embodiments. As shown in FIG. 2, the haptic switch 212 is a combination that includes a sensor 210 and a flooring sample 211. The haptic switch 222 is a combination that includes a sensor 220 and a flooring sample 221. The haptic switch 232 is a combination that includes a sensor 230 and a flooring sample 231. One or more of the sensors 210, 220, and 230 may be or include a proximity sensor, a touch sensor, a pressure sensor, or any suitable combination thereof. One or more of the flooring samples 211, 221, and 231 may be or include a piece of flooring material, such as ceramic tile, wood, carpet, or any suitable combination thereof.

The haptic switches 212, 222, and 232 are communicatively coupled to the sensor controller 250, as described above, and the sensor control 250 is communicatively coupled to the machine 260. The machine 260 may be, include, or function as a combination of the first machine and the second machine described above with respect to FIG. 1. As shown in FIG. 2, the machine 260 is specially configured (e.g., by suitable software) to detect which of the haptic switches 212, 222, and 232 has been operated (e.g., activated) by a user's proximity, touch, or pressure. Based on which of the haptic switches 212, 222, and 232 has been operated, the machine 260 selects and accesses corresponding texture map data (e.g., a set of one or more texture images that depict the flooring sample included in the operated haptic switch). The machine 260 then generates corresponding video content for the display screen 261 (e.g., a video floor or other floor-mounted display screen), generates corresponding video content for the display screen 263 (e.g., a video wall or other wall-mounted display screen), and causes the display screens 261 and 263 to present their respectively corresponding video content (e.g., by providing the respectively corresponding video content to each of the display screens 261 and 263).

According to various example embodiments, one or more of the methodologies described herein may facilitate generation and provision of dynamically generated video content for presentation on one or more immersive displays and thus interact with the user by modifying an environment, such as a booth or other walk-in structure (e.g., by modifying its visual appearance). Moreover, one or more of the methodologies described herein may facilitate provision of intuitive interface to conveniently touch, feel, and visualize one or more of various flooring styles. Hence, one or more of the methodologies described herein may facilitate presentation of haptic and visual information coupled together in the same immersive experience, as well as quick and convenient provision of large-scale visual understanding based on a small-scale flooring sample, compared to capabilities of pre-existing systems and methods.

Figure 3:
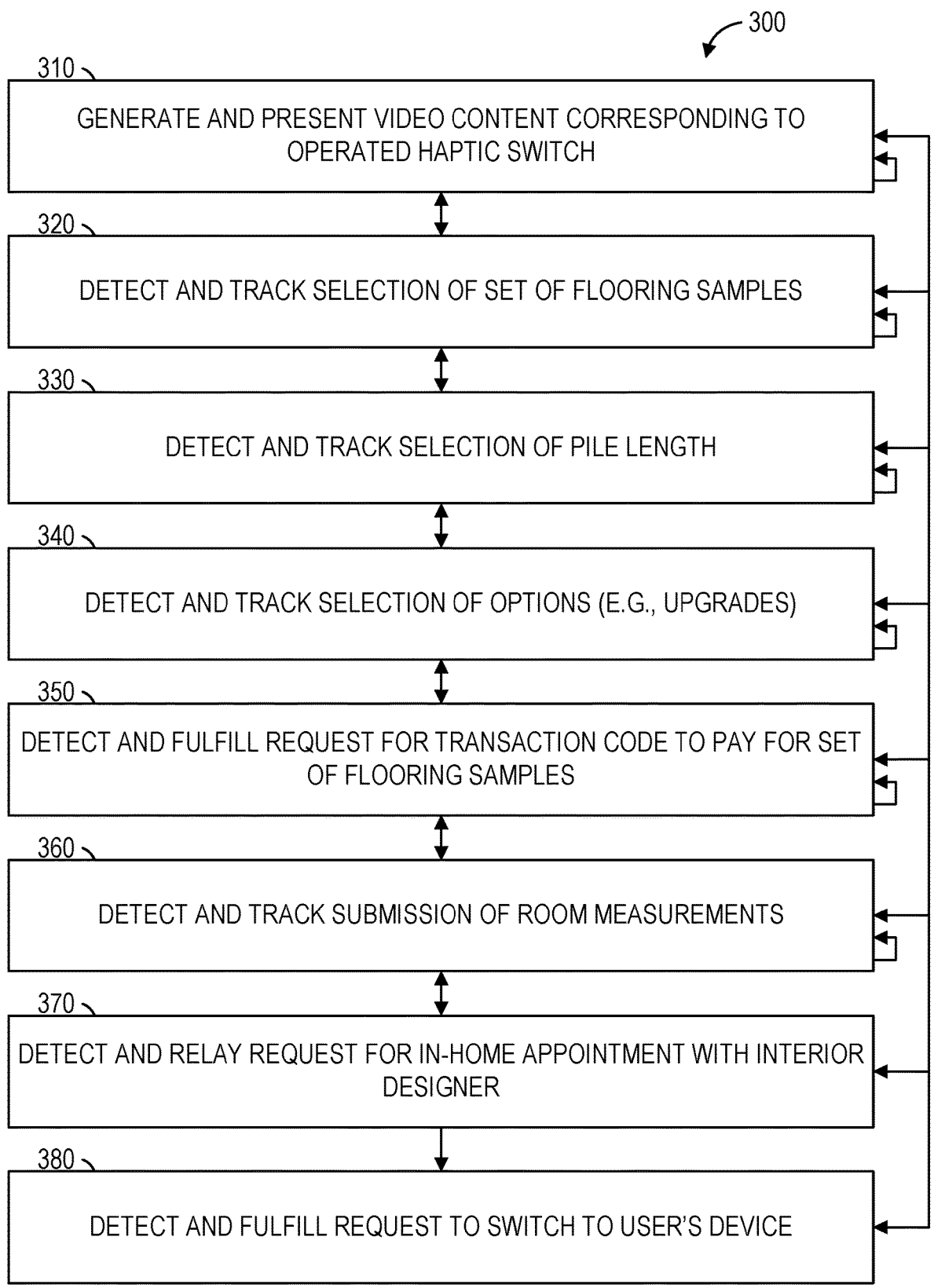
FIG. 3 is a flowchart illustrating operations in a method by which a machine (e.g., the video generation machine) interacts with a user, according to some example embodiments.

FIG. 3 is a flowchart illustrating operations in a method 300 by which a machine interacts with a user, according to some example embodiments. The machine may be or include the video generation machine 260 described above with respect to FIG. 2, any of the first, second, or third machines described above with respect to FIG. 1, the machine described below with respect to FIG. 4, or any suitable combination thereof.

As shown in FIG. 3, the method 300 includes one or more of operations 310, 320, 330, 340, 350, 360, 370, and 380, each and any of which may be performed by presenting a suitable graphical user interface (GUI) to the user (e.g., via a display screen controlled by the machine). For example, such a GUI may be generated by the machine and caused by the machine to be presented to the user on the touch screen shown in FIG. 1, the display screen 261 shown in FIG. 2, the display screen 263 shown in FIG. 2, or a portion of any one of these screens.

In operation 310, the machine generates and presents video content that corresponds to an operated haptic switch (e.g., as described above with respect to FIG. 2). For example, the machine may detect operation of the haptic switch 212, then select and access the corresponding texture map data for the operated haptic switch 212, then generate video content based on the accessed texture map data, and then cause one or more display screens (e.g., display screen 261) to present the generated video content.

In operation 320, the machine detects and tracks the user's selection of the set of one or more flooring samples. For example, each time a haptic switch (e.g., the haptic switch 212) is operated, the machine may cause the GUI to display a dialog window that asks the user whether the user would like to select the corresponding flooring sample for purchase (e.g., by adding an identifier of the flooring sample to a list of identifiers of selected flooring samples), and the user may provide an affirmative response that triggers the machine to store the user's selection of that flooring sample (e.g., by storing an identifier of the corresponding flooring sample in a database record that corresponds to the user).

In operation 330, the machine detects and tracks the user's selection of a pile length (e.g., a preferred pile length). For example, each time a haptic switch (e.g., the haptic switch 212) is operated, the machine may cause the GUI to display a dialog window that asks the user what pile length is preferred for the corresponding flooring sample. The dialog window may offer a set of options (e.g., short, thick, thicker, or plush), and the user may respond with a selection of one of those options for pile length. This may trigger the machine to store the user's selection of pile length (e.g., assigned to an identifier of the corresponding flooring sample and in a database record that corresponds to the user).

In operation 340, the machine detects and tracks the user's selection of one or more options (e.g., an upgrade) from an available set of one or more options (e.g., upgrades, such as various treatments for carpeting or hard flooring). Examples of such an option include an anti-static treatment, an anti-odor treatment, a water-repellent treatment, an oil-repellent treatment, an anti-dust treatment, an anti-allergen treatment, an anti-stain treatment, an anti-mold treatment, an anti-mildew treatment, or any suitable combination thereof. For example, each time a haptic switch (e.g., the haptic switch 212) is operated, the machine may cause the GUI to display a dialog window that asks the user whether any one or more of the available upgrades are to be selected for the corresponding flooring sample. The dialog window may offer a menu of options (e.g., one or more available upgrades), and the user may respond with a selection of one or more of those upgrades. This may trigger the machine to store the user's one or more selections of upgrades (e.g., assigned to an identifier of the corresponding flooring sample and in a database record that corresponds to the user).

In operation 350, the machine detects and fulfills a request for a transaction code to enable payment for the user's stored set of one or more selected flooring samples. The request may be detected by receiving the request via the GUI (e.g., via a dialog window presented on the display screen controlled by the machine) or by receiving the request via a text message interface configured to receive text messages via a wireless network (e.g., short messaging system (SMS) text messages via a cellular data network or a cellular telephony network). For example, the GUI may display a message that prompts the user to "Text 'xyz' to 55432 to receive a barcode for purchasing your selected flooring samples," and the user may respond to the prompt by sending the specified text message (e.g., "xyz") to the specified destination (e.g., 55432) from a mobile device (e.g., his or her smart phone). This text message may be received by the text message interface of the machine and trigger the machine to generate a transaction code (e.g., a barcode, a quick response (QR) code, an alphanumeric text string, or any suitable combination thereof) and provide the generated transaction code to the mobile device of the user.

According to various example embodiments, the transaction code can be displayed by the mobile device at a later point in time (e.g., when the user is at a checkout counter or other point-of-sale) and scanned by a code reader of a transaction processing device (e.g., operated by the user or a cashier), which may trigger the transaction processing device to initiate a payment transaction for the user's selected set of flooring samples, initiate an order to deliver the selected set of flooring samples to an address of the user (e.g., an address of the user's home), or both.

In operation 360, the machine detects and tracks one or more submissions of dimensional information for one or more rooms, which may be rooms in a home or workplace of the user. The dimensional information specifies physical dimensions (e.g., measurements) of the one or more rooms, such as the length and width of a room. Such dimensional information may be received by manual input (e.g., via the GUI presented on the display screen controlled by machine), wireless communication (e.g., sent from the user's mobile device via cellular network, Wi-Fi network, Internet, personal area network (PAN), near field communications (NFC), or any suitable combination thereof), a wired communication (e.g., via insertion of a storage device, such as a flash drive or memory card, into the machine or a peripheral thereof for reading removable storage devices), or any suitable combination thereof. Receipt of dimensional information may trigger the machine to store the received dimensional information (e.g., assigned to an identifier of the corresponding flooring sample and in a database record that corresponds to the user).

In operation 370, the machine detects and relays a request from the user for an in-home appointment with an interior designer. The request may be detected by receiving the request via the GUI (e.g., via a dialog window presented on the display screen controlled by the machine) or by receiving the request via a text message interface configured to receive text messages (e.g., as described above with respect to operation 350). For example, the GUI may display a message that prompts the user to "Text 'abc' to 55432 to request an in-home appointment with one of our interior designers," and the user may respond to the prompt by sending the specified text message (e.g., "abc") to the specified destination (e.g., 55432) from a mobile device (e.g., his or her smart phone). This text message may be received by the text message interface of the machine and trigger the machine to select an available interior designer and relay the user's request to a device (e.g., mobile device) of that interior designer.

According to various example embodiments, the machine generates a message for the selected interior designer and sends the generated message to the interior designer's device. The message may indicate that the user is requesting an in-home appointment to be arranged and may provide one or more contact details (e.g., anonymized or non-anonymized) usable to contact the user. In addition, the machine may cause the GUI to display a confirmation message indicating that an interior designer has been contacted, such that the user should expect to receive a communication from the interior designer to arrange the in-home appointment.

In operation 380, the machine detects and fulfills a request to store the current state of the user's work performed via the GUI (e.g., a first version thereof) and then switch to performing further work via another (e.g., similar or dissimilar) GUI (e.g., a second version thereof) to be displayed on a device of the user (e.g., the user's mobile device or the user's home computer), instead of the GUI currently displayed (e.g., on the display screen controlled by the machine). The request may be detected by receiving the request via the GUI (e.g., via a dialog window presented on the display screen controlled by the machine) or by receiving the request via a text message interface configured to receive text messages (e.g., as described above with respect to operation 350). For example, the GUI may display a message that prompts the user to "Text 'ijk' to 55432 to continue this shopping session online using your mobile device," and the user may respond to the prompt by sending the specified text message (e.g., "ikj") to the specified destination (e.g., 55432) from a mobile device (e.g., his or her smart phone). This text message may be received by the text message interface of the machine and trigger the machine to store the current state of the user's work (e.g., a stored set of one or more selected flooring samples, a selection of pile length, a selection of one or more upgrades, submitted dimensional information, etc.), close the GUI displayed on the display screen, generate and send a link to an alternative GUI to the user's mobile device, or any suitable combination thereof. The generated link to the alternative GUI, when activated (e.g., clicked or touched), may cause a browser on the user's mobile device to load and present the alternative GUI, which may be configured based on some or all of the stored current state of the user's work.

When these effects are considered in aggregate, one or more of the methodologies described herein may obviate a need for certain efforts or resources that otherwise would be involved in generation and provision of such dynamically generated video content. Efforts expended by a system administrator in providing a user with such an intuitive and immersive experience may be reduced by use of (e.g., reliance upon) a special-purpose machine that implements one or more of the methodologies described herein. Computing resources used by one or more systems or machines may similarly be reduced (e.g., compared to systems or machines that lack the structures discussed herein or are otherwise unable to perform the functions discussed herein). Examples of such computing resources include processor cycles, network traffic, computational capacity, main memory usage, graphics rendering capacity, graphics memory usage, data storage capacity, power consumption, and cooling capacity.

Figure 4:
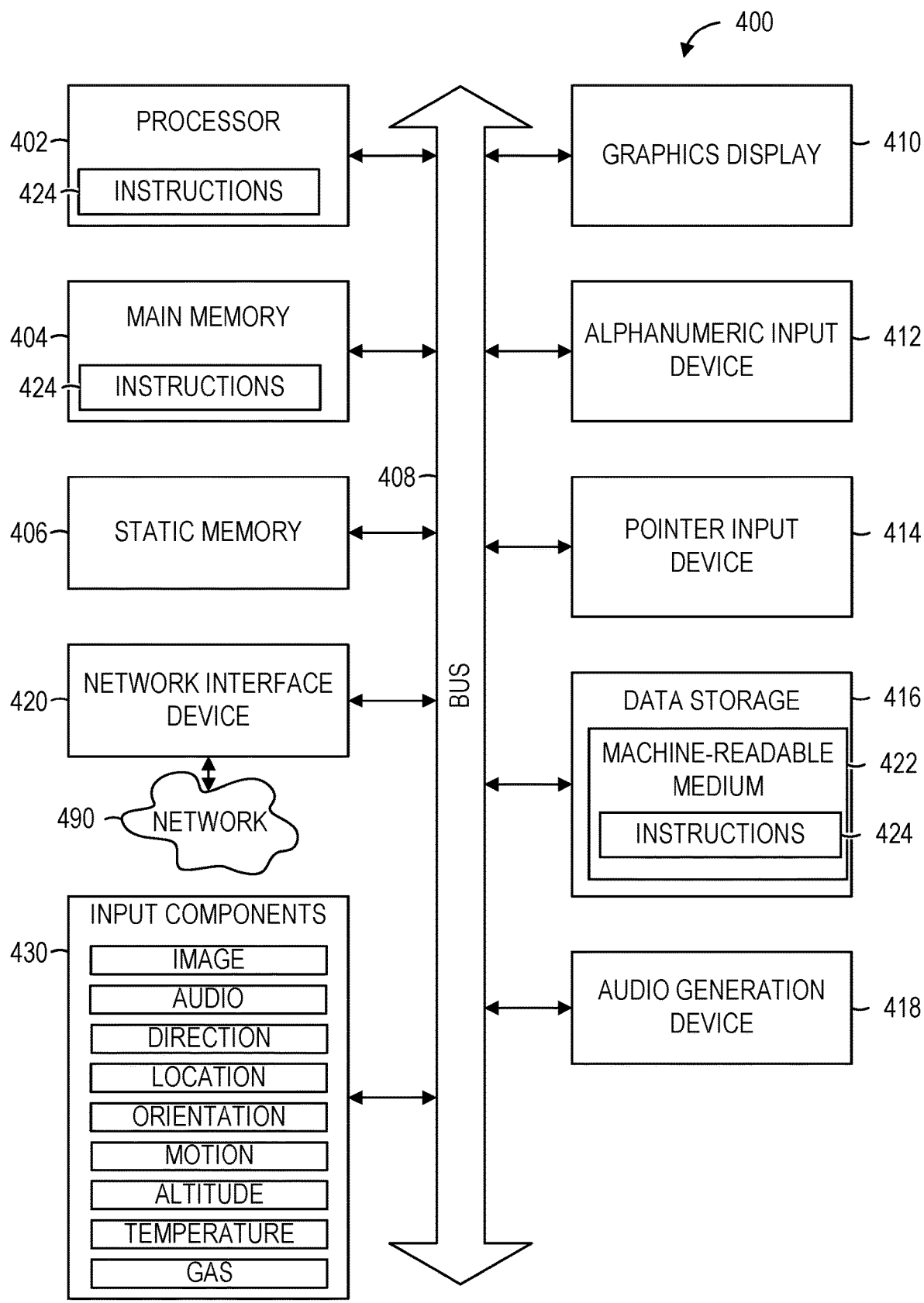
FIG. 4 is a block diagram illustrating components of a machine, according to some example embodiments, able to read instructions from a machine-readable medium and perform any one or more of the methodologies discussed herein.

FIG. 4 is a block diagram illustrating components of a machine 400, according to some example embodiments, able to read instructions 424 from a machine-readable medium 422 (e.g., a non-transitory machine-readable medium, a machine-readable storage medium, a computer-readable storage medium, or any suitable combination thereof) and perform any one or more of the methodologies discussed herein, in whole or in part. Specifically, FIG. 4 shows the machine 400 in the example form of a computer system (e.g., a computer) within which the instructions 424 (e.g., software, a program, an application, an applet, an app, or other executable code) for causing the machine 400 to perform any one or more of the methodologies discussed herein may be executed, in whole or in part.

In alternative embodiments, the machine 400 operates as a standalone device or may be communicatively coupled (e.g., networked) to other machines. In a networked deployment, the machine 400 may operate in the capacity of a server machine or a client machine in a server-client network environment, or as a peer machine in a distributed (e.g., peer-to-peer) network environment. The machine 400 may be a server computer, a client computer, a personal computer (PC), a tablet computer, a laptop computer, a netbook, a cellular telephone, a smart phone, a set-top box (STB), a personal digital assistant (PDA), a web appliance, a network router, a network switch, a network bridge, or any machine capable of executing the instructions 424, sequentially or otherwise, that specify actions to be taken by that machine. Further, while only a single machine is illustrated, the term "machine" shall also be taken to include any collection of machines that individually or jointly execute the instructions 424 to perform all or part of any one or more of the methodologies discussed herein.

The machine 400 includes a processor 402 (e.g., one or more central processing units (CPUs), one or more graphics processing units (GPUs), one or more digital signal processors (DSPs), one or more application specific integrated circuits (ASICs), one or more radio-frequency integrated circuits (RFICs), or any suitable combination thereof), a main memory 404, and a static memory 406, which are configured to communicate with each other via a bus 408. The processor 402 contains solid-state digital microcircuits (e.g., electronic, optical, or both) that are configurable, temporarily or permanently, by some or all of the instructions 424 such that the processor 402 is configurable to perform any one or more of the methodologies described herein, in whole or in part. For example, a set of one or more microcircuits of the processor 402 may be configurable to execute one or more modules (e.g., software modules) described herein. In some example embodiments, the processor 402 is a multicore CPU (e.g., a dual-core CPU, a quad-core CPU, an 8-core CPU, or a 128-core CPU) within which each of multiple cores behaves as a separate processor that is able to perform any one or more of the methodologies discussed herein, in whole or in part. Although the beneficial effects described herein may be provided by the machine 400 with at least the processor 402, these same beneficial effects may be provided by a different kind of machine that contains no processors (e.g., a purely mechanical system, a purely hydraulic system, or a hybrid mechanical-hydraulic system), if such a processor-less machine is configured to perform one or more of the methodologies described herein.

The machine 400 may further include a graphics display 410 (e.g., a plasma display panel (PDP), a light emitting diode (LED) display, a liquid crystal display (LCD), a projector, a cathode ray tube (CRT), or any other display capable of displaying graphics or video). The machine 400 may also include an alphanumeric input device 412 (e.g., a keyboard or keypad), a pointer input device 414 (e.g., a mouse, a touchpad, a touchscreen, a trackball, a joystick, a stylus, a motion sensor, an eye tracking device, a data glove, or other pointing instrument), a data storage 416, an audio generation device 418 (e.g., a sound card, an amplifier, a speaker, a headphone jack, or any suitable combination thereof), and a network interface device 420.

The data storage 416 (e.g., a data storage device) includes the machine-readable medium 422 (e.g., a tangible and non-transitory machine-readable storage medium) on which are stored the instructions 424 embodying any one or more of the methodologies or functions described herein. The instructions 424 may also reside, completely or at least partially, within the main memory 404, within the static memory 406, within the processor 402 (e.g., within the processor's cache memory), or any suitable combination thereof, before or during execution thereof by the machine 400. Accordingly, the main memory 404, the static memory 406, and the processor 402 may be considered machine-readable media (e.g., tangible and non-transitory machine-readable media). The instructions 424 may be transmitted or received over the network 490 via the network interface device 420. For example, the network interface device 420 may communicate the instructions 424 using any one or more transfer protocols (e.g., hypertext transfer protocol (HTTP)).

In some example embodiments, the machine 400 may be a portable computing device (e.g., a smart phone, a tablet computer, or a wearable device) and may have one or more additional input components 430 (e.g., sensors or gauges). Examples of such input components 430 include an image input component (e.g., one or more cameras), an audio input component (e.g., one or more microphones), a direction input component (e.g., a compass), a location input component (e.g., a global positioning system (GPS) receiver), an orientation component (e.g., a gyroscope), a motion detection component (e.g., one or more accelerometers), an altitude detection component (e.g., an altimeter), a temperature input component (e.g., a thermometer), and a gas detection component (e.g., a gas sensor). Input data gathered by any one or more of these input components 430 may be accessible and available for use by any of the modules described herein (e.g., with suitable privacy notifications and protections, such as opt-in consent or opt-out consent, implemented in accordance with user preference, applicable regulations, or any suitable combination thereof).

As used herein, the term "memory" refers to a machine-readable medium able to store data temporarily or permanently and may be taken to include, but not be limited to, random-access memory (RAM), read-only memory (ROM), buffer memory, flash memory, and cache memory. While the machine-readable medium 422 is shown in an example embodiment to be a single medium, the term "machine-readable medium" should be taken to include a single medium or multiple media (e.g., a centralized or distributed database, or associated caches and servers) able to store instructions. The term "machine-readable medium" shall also be taken to include any medium, or combination of multiple media, that is capable of carrying (e.g., storing or communicating) the instructions 424 for execution by the machine 400, such that the instructions 424, when executed by one or more processors of the machine 400 (e.g., processor 402), cause the machine 400 to perform any one or more of the methodologies described herein, in whole or in part. Accordingly, a "machine-readable medium" refers to a single storage apparatus or device, as well as cloud-based storage systems or storage networks that include multiple storage apparatus or devices. The term "machine-readable medium" shall accordingly be taken to include, but not be limited to, one or more tangible and non-transitory data repositories (e.g., data volumes) in the example form of a solid-state memory chip, an optical disc, a magnetic disc, or any suitable combination thereof.

A "non-transitory" machine-readable medium, as used herein, specifically excludes propagating signals per se. According to various example embodiments, the instructions 424 for execution by the machine 400 can be communicated via a carrier medium (e.g., a machine-readable carrier medium). Examples of such a carrier medium include a non-transient carrier medium (e.g., a non-transitory machine-readable storage medium, such as a solid-state memory that is physically movable from one place to another place) and a transient carrier medium (e.g., a carrier wave or other propagating signal that communicates the instructions 424).

Certain example embodiments are described herein as including modules. Modules may constitute software modules (e.g., code stored or otherwise embodied in a machine-readable medium or in a transmission medium), hardware modules, or any suitable combination thereof. A "hardware module" is a tangible (e.g., non-transitory) physical component (e.g., a set of one or more processors) capable of performing certain operations and may be configured or arranged in a certain physical manner. In various example embodiments, one or more computer systems or one or more hardware modules thereof may be configured by software (e.g., an application or portion thereof) as a hardware module that operates to perform operations described herein for that module.

In some example embodiments, a hardware module may be implemented mechanically, electronically, hydraulically, or any suitable combination thereof. For example, a hardware module may include dedicated circuitry or logic that is permanently configured to perform certain operations. A hardware module may be or include a special-purpose processor, such as a field programmable gate array (FPGA) or an ASIC. A hardware module may also include programmable logic or circuitry that is temporarily configured by software to perform certain operations. As an example, a hardware module may include software encompassed within a CPU or other programmable processor. It will be appreciated that the decision to implement a hardware module mechanically, hydraulically, in dedicated and permanently configured circuitry, or in temporarily configured circuitry (e.g., configured by software) may be driven by cost and time considerations.

Accordingly, the phrase "hardware module" should be understood to encompass a tangible entity that may be physically constructed, permanently configured (e.g., hardwired), or temporarily configured (e.g., programmed) to operate in a certain manner or to perform certain operations described herein. Furthermore, as used herein, the phrase "hardware-implemented module" refers to a hardware module. Considering example embodiments in which hardware modules are temporarily configured (e.g., programmed), each of the hardware modules need not be configured or instantiated at any one instance in time. For example, where a hardware module includes a CPU configured by software to become a special-purpose processor, the CPU may be configured as respectively different special-purpose processors (e.g., each included in a different hardware module) at different times. Software (e.g., a software module) may accordingly configure one or more processors, for example, to become or otherwise constitute a particular hardware module at one instance of time and to become or otherwise constitute a different hardware module at a different instance of time.

Hardware modules can provide information to, and receive information from, other hardware modules. Accordingly, the described hardware modules may be regarded as being communicatively coupled. Where multiple hardware modules exist contemporaneously, communications may be achieved through signal transmission (e.g., over circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory (e.g., a memory device) to which it is communicatively coupled. A further hardware module may then, at a later time, access the memory to retrieve and process the stored output. Hardware modules may also initiate communications with input or output devices, and can operate on a resource (e.g., a collection of information from a computing resource).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions described herein. As used herein, "processor-implemented module" refers to a hardware module in which the hardware includes one or more processors. Accordingly, the operations described herein may be at least partially processor-implemented, hardware-implemented, or both, since a processor is an example of hardware, and at least some operations within any one or more of the methods discussed herein may be performed by one or more processor-implemented modules, hardware-implemented modules, or any suitable combination thereof.

Moreover, such one or more processors may perform operations in a "cloud computing" environment or as a service (e.g., within a "software as a service" (SaaS) implementation). For example, at least some operations within any one or more of the methods discussed herein may be performed by a group of computers (e.g., as examples of machines that include processors), with these operations being accessible via a network (e.g., the Internet) and via one or more appropriate interfaces (e.g., an application program interface (API)). The performance of certain operations may be distributed among the one or more processors, whether residing only within a single machine or deployed across a number of machines. In some example embodiments, the one or more processors or hardware modules (e.g., processor-implemented modules) may be located in a single geographic location (e.g., within a home environment, an office environment, or a server farm). In other example embodiments, the one or more processors or hardware modules may be distributed across a number of geographic locations.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and their functionality presented as separate components and functions in example configurations may be implemented as a combined structure or component with combined functions. Similarly, structures and functionality presented as a single component may be implemented as separate components and functions. These and other variations, modifications, additions, and improvements fall within the scope of the subject matter herein.

Some portions of the subject matter discussed herein may be presented in terms of algorithms or symbolic representations of operations on data stored as bits or binary digital signals within a memory (e.g., a computer memory or other machine memory). Such algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "accessing," "processing," "detecting," "computing," "calculating," "determining," "generating," "presenting," "displaying," or the like refer to actions or processes performable by a machine (e.g., a computer) that manipulates or transforms data represented as physical (e.g., electronic, magnetic, or optical) quantities within one or more memories (e.g., volatile memory, non-volatile memory, or any suitable combination thereof), registers, or other machine components that receive, store, transmit, or display information. Furthermore, unless specifically stated otherwise, the terms "a" or "an" are herein used, as is common in patent documents, to include one or more than one instance. Finally, as used herein, the conjunction "or" refers to a non-exclusive "or," unless specifically stated otherwise.

The following enumerated descriptions describe various examples of systems, structures, methods, machine-readable media, and other components discussed herein.

A first example provides a system comprising:

a haptic switch that includes a sensor and a sample of material (e.g., a flooring sample, an upholstery sample, a wall covering sample, a kitchen surface sample, a bathroom surface sample, or any suitable combination thereof);

a display screen; and a machine communicatively coupled to the haptic switch and to the display screen, the machine comprising one or more processors storing instructions that, when executed by the one or more processors, cause the machine to perform operations comprising:

detecting operation of the haptic switch by detecting activation of the sensor in response to manipulation of the sample of material by a user;

selecting and accessing texture map data that corresponds to the sample of material in response to the detected operation of the haptic switch;
generating video content based on the accessed texture map data that corresponds to the sample of material; and
causing the generated video content to be presented by the display screen in response to the manipulation of the sample of material by the user.

A second example provides a system according to the first example, wherein:
the generating of the video content based on the selected texture map data includes generating a picture of a floor by at least one of tiling the texture map data or scaling the texture map data.

A third example provides a system according to the first example, wherein:
the generating of the video content based on the selected texture map data includes:
accessing a three-dimensional (3D) model of a room; and
rendering a picture of the room by applying the texture map data to the accessed 3D model of the room.

A fourth example provides a system according to the third example, wherein:
the accessing of the 3D model of the room includes accessing a predetermined 3D model of a predetermined room.

A fifth example provides a system according to the third example, wherein:
the operations further comprise:
accessing at least one image of the room from a storage device controlled by the user; and
the accessing of the 3D model of the room includes generating a custom 3D model of the room based on the accessed at least one image of the room.

A sixth example provides a system according to any of the first through fifth examples, wherein:
the generating of the video content based on the selected texture map data includes generating a picture of a ceiling by at least one of tiling the texture metadata or scaling the textual data.

A seventh example provides a system according to any of the first through sixth examples, wherein:
the sensor in the haptic switch includes at least one of a proximity sensor, touch sensor, or pressure sensor.

An eighth example provides a system according to any of the first through seventh examples, wherein:
the sample of material in the haptic switch includes flooring material selected from a group consisting of tile, wood, and carpet.

A ninth example provides a system according to any of the first through eighth examples, wherein:
multiple texture map data correspond to the sample of material;
the operations further comprise:
detecting that the user selected a disambiguation criterion that identifies the texture map data among the multiple texture map data that correspond to the sample of material; and
the selecting and accessing of the texture map data is based on the disambiguation criterion selected by the user.

A tenth example provides a structure comprising:
wall-mounted display screen;
a floor-mounted display screen;
a plurality of haptic switches that each include a corresponding sensor and a corresponding sample of material (e.g., a flooring sample, an upholstery sample, a wall covering sample, a kitchen surface sample, a bathroom surface sample, or any suitable combination thereof);
a machine communicatively coupled to the haptic switch, to the wall-mounted display screen, and to the floor-mounted display screen, the machine comprising one or more processors storing instructions that, when executed by the one or more processors, cause the machine to perform operations comprising:
detecting operation of a haptic switch among the plurality of haptic switches by detecting activation of the corresponding sensor in the haptic switch in response to manipulation of the corresponding sample of material by a user;
selecting and accessing texture map data that corresponds to the sample of material in response to the detected operation of the haptic switch;
generating first video content for the wall-mounted display screen based on the accessed texture map data;
generating second video content for the floor-mounted display screen based on the accessed texture map data;
causing the wall-mounted display screen to present the generated first video content; and
causing the floor-mounted display screen to present the generate a second video content.

An eleventh example provides a structured according to the tenth example, wherein:
the generating of the second video content for the floor-mounted display screen based on the selected texture map data includes generating a picture of a floor by at least one of tiling the texture map data or scaling the texture map data.

A twelfth example provides a structure according to the tenth example or the eleventh example, wherein:
the generating of the first video content for the wall-mounted display screen based on the selected texture map data includes:
accessing a three-dimensional (3D) model of a room; and
rendering a picture of the room by applying the texture map data to the accessed 3D model of the room.

A thirteenth example provides a structure according to the twelfth example, wherein:
the accessing of the 3D model of the room includes accessing a predetermined 3D model of a predetermined room.

A fourteenth example provides a structure according to the twelfth example, wherein:
the operations further comprise:
accessing at least one image of the room from a storage device controlled by the user; and
the accessing of the 3D model of the room includes generating a custom 3D model of the room based on the accessed at least one image of the room.

A fifteenth example provides a structure according to any of the tenth through fourteenth examples, wherein:
multiple texture map data correspond to the sample of material;
the operations further comprise:
detecting that the user selected a disambiguation criterion that identifies the texture map data among the multiple texture map data that correspond to the sample of material; and
the selecting and accessing of the texture map data is based on the disambiguation criterion selected by the user.

A sixteenth example provides a system comprising:
one or more processors; and
a memory storing instructions that, when executed by at least one processor among the one or more processors, cause the system to perform operations comprising:
detecting operation of a haptic switch that includes a sensor and a sample of material (e.g., a flooring sample, an upholstery sample, a wall covering sample, a kitchen surface sample, a bathroom surface sample, or any suitable combination thereof) by detecting activation of the sensor of the haptic switch in response to manipulation of the sample of material by a user;

selecting and accessing texture map data that corresponds to the sample of material included in the haptic switch in response to the detected operation of the haptic switch;

generating video content based on the accessed texture map data that corresponds to the sample of material included in the haptic switch; and causing the generated video content to be presented by a display screen in response to the manipulation of the sample of material included in the haptic switch.

A seventeenth example provides a system according to the sixteenth example, wherein:

the generating of the video content based on the selected texture map data includes generating a picture of a floor by at least one of tiling the texture map data or scaling the texture map data.

An eighteenth example provides a system according to the sixteenth example, wherein:

the generating of the video content based on the selected texture map data includes:

accessing a three-dimensional (3D) model of a room; and rendering a picture of the room by applying the texture map data to the accessed 3D model of the room.

A nineteenth example provides a system according to the eighteenth example, wherein:

the operations further comprise:

accessing at least one image of the room from a storage device controlled by the user; and the accessing of the 3D model of the room includes generating a custom 3D model of the room based on the accessed at least one image of the room.

A twentieth example provides a system according to any of the sixteenth through nineteenth examples, wherein:

multiple texture map data correspond to the sample of material;

the operations further comprise:

detecting that the user selected a disambiguation criterion that identifies the texture map data among the multiple texture map data that correspond to the sample of material; and the selecting and accessing of the texture map data is based on the disambiguation criterion selected by the user.

A twenty-first example provides a carrier medium carrying machine-readable instructions for controlling a machine to carry out the operations performed in any one of the previously described examples.

What is claimed is:

1. A system comprising:
    material samples, wherein the material samples comprise at least one of different flooring material samples, different upholstery material samples, different wall covering material samples, different kitchen surface material samples, or different bathroom surface material samples;
    electronic sensors, wherein each of the electronic sensors is mechanically coupled to one of the material samples that is associated with the electronic sensor;
    a display screen; and
    a computing device communicatively coupled to the electronic sensors and the display screen, wherein the computing device comprises one or more processors and a memory device storing instructions that, when executed by the one or more processors, cause the computing device to perform operations comprising:
        detecting activation of one of the electronic sensors, by a user, in response to manipulation of the material sample associated with the activated electronic sensor;
        selecting and accessing texture map data that corresponds to the material sample associated with the activated electronic sensor in response to the detected activation of the electronic sensor;
        generating video content based on the accessed texture map data that corresponds to the material sample associated with the activated electronic sensor; and
        causing the generated video content to be presented by the display screen in response to the manipulation of the material sample associated with the activated electronic sensor.

2. The system of claim 1, wherein:
    the generating of the video content based on the selected texture map data includes generating a picture of a floor by at least one of tiling the texture map data or scaling the texture map data.

3. The system of claim 1, wherein:
    the generating of the video content based on the selected texture map data includes:
        accessing a three-dimensional (3D) model of a room; and
        rendering a picture of the room by applying the texture map data to the accessed 3D model of the room.

4. The system of claim 3, wherein:
    the accessing of the 3D model of the room includes accessing a predetermined 3D model of a predetermined room.

5. The system of claim 3, wherein the operations performed by the computing device further comprise:
    accessing at least one image of the room from a storage device controlled by the user; and
    the accessing of the 3D model of the room includes generating a custom 3D model of the room based on the accessed at least one image of the room.

6. The system of claim 1, wherein:
    the generating of the video content based on the selected texture map data includes generating a picture of a ceiling by at least one of tiling the texture map data or scaling the texture map data.

7. The system of claim 1, wherein:
    the electronic sensors comprise at least one of proximity sensors, touch sensors, or pressure sensors.

8. The system of claim 1, wherein:
    the material samples comprise different flooring material samples selected from a group consisting of tile samples, wood flooring samples, and carpet samples.

9. The system of claim 1, wherein:
    multiple texture map data correspond to the material sample associated with the activated electronic sensor; and
    the operations performed by the computing device further comprise:
        detecting that the user selected a disambiguation criterion that identifies the texture map data among the multiple texture map data that correspond to the material sample associated with the activated electronic sensor; and
        the selecting and accessing of the texture map data is based on the disambiguation criterion selected by the user.

10. A system comprising:
    a wall-mounted display screen;
    a floor-mounted display screen;

a plurality of haptic switches that each include a corresponding sensor and a corresponding sample of material;
material samples, wherein the material samples comprise at least one of different flooring material samples, different upholstery material samples, different wall covering material samples, different kitchen surface material samples, or different bathroom surface material samples;
electronic sensors, wherein each of the electronic sensors is mechanically coupled to one of the material samples that is associated with the electronic sensor;
a computing device communicatively coupled to the electronic sensors, the wall-mounted display screen, and the floor-mounted display screen, wherein the computing device comprises one or more processors and a memory device storing instructions that, when executed by the one or more processors, cause the computing device to perform operations comprising:
detecting activation of one of the electronic sensors, by a user, in response to manipulation of the material sample associated with the activated electronic sensor;
selecting and accessing texture map data that corresponds to the material sample associated with the activated electronic sensor in response to the detected activation of the electronic sensor;
generating first video content for the wall-mounted display screen based on the accessed texture map data;
generating second video content for the floor-mounted display screen based on the accessed texture map data;
causing the wall-mounted display screen to present the generated first video content; and
causing the floor-mounted display screen to present the generate a second video content.

11. The system of claim 10, wherein:
the generating of the second video content for the floor-mounted display screen based on the selected texture map data includes generating a picture of a floor by at least one of tiling the texture map data or scaling the texture map data.

12. The system of claim 10, wherein the generating of the first video content for the wall-mounted display screen based on the selected texture map data includes:
accessing a three-dimensional (3D) model of a room; and
rendering a picture of the room by applying the texture map data to the accessed 3D model of the room.

13. The system of claim 12, wherein:
the accessing of the 3D model of the room includes accessing a predetermined 3D model of a predetermined room.

14. The system of claim 12, wherein the operations performed by the computing device further comprise:
accessing at least one image of the room from a storage device controlled by the user; and
the accessing of the 3D model of the room includes generating a custom 3D model of the room based on the accessed at least one image of the room.

15. The system of claim 10, wherein:
multiple texture map data correspond to the sample of material the material sample associated with the activated electronic sensor; and the operations performed by the computing device further comprise:
detecting that the user selected a disambiguation criterion that identifies the texture map data among the multiple texture map data that correspond to the material sample associated with the activated electronic sensor; and
the selecting and accessing of the texture map data is based on the disambiguation criterion selected by the user.

16. A system comprising:
one or more processors; and
a memory device storing instructions that, when executed by at least one processor among the one or more processors, cause the system to perform operations comprising:
detecting activation of an electronic sensor, by a user, in response to manipulation of a material sample associated with the activated electronic sensor;
selecting and accessing texture map data that corresponds to the material sample associated with the activated electronic sensor in response to the detected activation of the electronic sensor;
generating video content based on the accessed texture map data that corresponds to the material sample associated with the activated electronic sensor; and
causing the generated video content to be presented by a display screen in response to the manipulation of the material sample associated with the activated electronic sensor.

17. The system of claim 16, wherein:
the generating of the video content based on the selected texture map data includes generating a picture of a floor by at least one of tiling the texture map data or scaling the texture map data.

18. The system of claim 16, wherein the generating of the video content based on the selected texture map data includes:
accessing a three-dimensional (3D) model of a room; and
rendering a picture of the room by applying the texture map data to the accessed 3D model of the room.

19. The system of claim 18, wherein the operations performed by the system further comprise:
accessing at least one image of the room from a storage device controlled by the user; and
the accessing of the 3D model of the room includes generating a custom 3D model of the room based on the accessed at least one image of the room.

20. The system of claim 16, wherein:
multiple texture map data correspond to the material sample associated with the activated electronic sensor; and
the operations performed by the system further comprise:
detecting that the user selected a disambiguation criterion that identifies the texture map data among the multiple texture map data that correspond to the material sample associated with the activated electronic sensor; and
the selecting and accessing of the texture map data is based on the disambiguation criterion selected by the user.

* * * * *